United States Patent [19]
Horiuchi et al.

[11] Patent Number: 5,781,083
[45] Date of Patent: Jul. 14, 1998

[54] SURFACE WAVE RESONATOR HAVING A PLURALITY OF RESONANCE FREQUENCIES

[75] Inventors: Hideya Horiuchi; Michio Kadota, both of Kyoto; Junya Ago, Nagaokakyo, all of Japan

[73] Assignee: Murata Manufacturing Co., Ltd., Japan

[21] Appl. No.: 613,074

[22] Filed: Mar. 8, 1996

[30] Foreign Application Priority Data

Mar. 8, 1995 [JP] Japan ................... 7-048159

[51] Int. Cl.$^6$ .................. H03H 9/00; H03H 9/64
[52] U.S. Cl. ............ 333/196; 333/193; 310/313 C
[58] Field of Search .................. 333/193–196; 310/313 R, 313 B, 313 C, 313 D

[56] References Cited

U.S. PATENT DOCUMENTS

| | | | |
|---|---|---|---|
| 4,007,433 | 2/1977 | Houkawa et al. | 333/196 |
| 4,602,288 | 7/1986 | Everett | 333/196 |
| 5,204,575 | 4/1993 | Kanda et al. | 333/195 |

OTHER PUBLICATIONS

Elastic Surface Wave Engineering, supervised by Inuo Shibayama, Electrical Information Communication Society Corp., pp. 66–68.

International Electrical Technology Report, No. 16, 1992, pp. 1–7.

Lecture Papers of Japan Acoustic Society, pp. 351–352 issued Mar. 1976.

*Primary Examiner*—Benny Lee
*Assistant Examiner*—Darius Gambino
*Attorney, Agent, or Firm*—Ostrolenk, Faber, Gerb & Soffen, LLP

[57] ABSTRACT

A free edge reflective-type surface wave resonator for reflecting SH-type surface waves between two confronting free edges of a piezoelectric substrate includes a piezoelectric substrate having two confronting free edges and an interdigital transducer having a plurality of electrode fingers which are weighted by a cross width weighting method or an electrode thinning method. The weighting of the electrode fingers is performed so that an attenuation pole of a main lobe of the weighted IDT is located outside of a frequency of an attenuation pole of a normal non-weighted IDT which has the same number of electrode finger pairs as the weighted IDT. The weighting of the electrodes is such that the main lobe of the weighted IDT and a plurality of resonance characteristics determined by the attenuation poles of the normal unweighted IDT are obtained.

5 Claims, 4 Drawing Sheets

5,781,083

SURFACE WAVE RESONATOR HAVING A PLURALITY OF RESONANCE FREQUENCIES

BACKGROUND OF THE INVENTION

1. Field of the Invention

The present invention relates to a free edge reflective-type surface wave resonator using SH-type surface waves such as BGS waves, Love waves or the like, and particularly to a free edge reflective-type surface wave resonator in which plural resonance units are fabricated as a single unitary element.

2. Description of Related Art

A television receiver, a video tape recorder, and other similar devices have been required to sufficiently attenuate signals at an adjacent channel picture carrier frequency $f_{ap}$ (31.9 MHz in European PAL system) and the adjacent channel sound carrier frequency $f_{as}$ (40.4 MHz in European PAL system) at a picture intermediate frequency stage thereof in order to avoid any obstruction between adjacent channels. FIG. 1 is a graph showing an attenuation-frequency characteristic at the picture intermediate frequency stage. It is apparent from FIG. 1 that the attenuation is relatively large at the adjacent channel picture carrier frequency $f_{ap}$ and the adjacent channel sound carrier frequency $f_{as}$.

In order to keep the attenuation large at the adjacent channel picture carrier frequency $f_{ap}$ and the adjacent channel sound carrier frequency $f_{ap}$ as described above, two conventional traps have been used. One of the conventional traps has a large attenuation at the adjacent channel picture carrier frequency $f_{ap}$ and the other conventional trap has a large attenuation at the adjacent channel picture carrier frequency $f_{as}$. Each of the conventional traps is constructed by an LC resonance circuit, a piezoelectric resonator, etc.

With respect to the piezoelectric resonator which is used for the above purpose, much attention has been paid to a piezoelectric resonator using SH-type surface waves such as BGS waves. FIG. 2 is a perspective view showing a free edge reflective-type surface wave resonator using BGS waves.

A free edge reflective-type surface wave resonator 1 is constructed by a piezoelectric substrate 2 having a substantially rectangular flat surface. The piezoelectric substrate 2 is formed of piezoelectric material such as piezoelectric ceramic of lead titanate zirconate, LiNbO₃ piezoelectric monocrystal, LiTaO₃ monocrystal or the like. When the substrate 2 is formed of piezoelectric ceramic, the substrate 2 is subjected to a polarization treatment in a direction as indicated by an arrow P in FIG. 2. A pair of comb-shaped electrodes 3 and 4 are provided on the upper surface 2a of the piezoelectric substrate 2 to form an interdigital transducer (hereinafter referred to as "IDT"). Each of the comb-shaped electrodes 3 and 4 has plural electrode fingers 3a to 3c and 4a to 4c, respectively.

By applying an alternating voltage through the comb-shaped electrodes 3 and 4, BGS waves are excited on the free edge reflective-type surface wave resonator 1, and the BGS waves propagate in a direction as indicated by an arrow X in FIG. 2. The BGS waves are reflected between the free edges 2b and 2c of the piezoelectric substrate 2. The free edge reflective-type surface wave resonator 1 can obtain an effective resonance characteristic by setting the frequency determined by the IDT and the frequency determined by the dimension between the free edges to be substantially equal to each other.

However, the free edge reflective-type surface resonator only has a single resonance characteristic like an LC resonance circuit and other types of piezoelectric resonators. Accordingly, two surface wave resonators must be prepared and connected to each other to achieve a trap characteristic at the two frequency positions (the adjacent channel picture carrier frequency $f_{ap}$ and the adjacent channel sound carrier frequency $f_{as}$).

An elastic surface wave resonator using Rayleigh waves has been known as another type surface wave resonator. This elastic surface wave resonator has two resonance characteristics although it uses a single resonator, as disclosed in "INTERNATIONAL ELECTRICAL TECHNOLOGY REPORT", No. 16, pp. 1–7, 1992, for example. That is, there is known a double mode resonator using a zero-order longitudinal mode (fundamental mode) and a second-order longitudinal mode in a surface wave resonator filter using Rayleigh waves, and two resonance characteristics are obtained by this resonator. However, the double mode resonator needs two or more IDTs and reflectors. Further, in the double mode resonator, the resonance characteristics are determined on the basis of the frequency characteristic of reflection coefficient of the reflector. Furthermore, a frequency range where a large reflection coefficient is obtained is narrow. Therefore, the difference between the two resonance points is a very small value, for example, about 1 MHz in a range where an excellent resonance characteristic is obtained. Thus, it is impossible to construct a double mode resonator including two trap resonators which have such a characteristic as shown in FIG. 1 and which have a large frequency gap therebetween.

Therefore, it may be considered that if two IDTs are provided on the piezoelectric substrate to form two resonance units in the free edge reflective-type surface wave resonator using BGS waves as described above, two resonance characteristics can be obtained. However, in the free edge reflective-type surface wave resonator using SH-type surface waves such as BGS waves, schematically shown in FIG. 3, the following relationship is satisfied between the wavelength λ of the IDT and the distance L of the two confronting free edges where the surface wave of the piezoelectric substrate is reflected:

$$L = (\lambda/2) \times N \quad (N \text{ represents an integer})$$

Since the frequency difference between $f_{ap}$ and $f_{as}$ is large, the wavelengths λ of the respective IDTs differ greatly from each other. For example, assuming the sound velocity of the PZT substrate to be equal to 2400 m/s, λap for $f_{ap}$=75.2 μm and λ as for $f_{as}$=59.4 μm in case of the PAL system. Accordingly, the value of the distance L between the two confronting free edges is different between the resonance unit having a resonance point at the adjacent channel picture carrier frequency $f_{ap}$ and the resonance unit having a resonance point at the adjacent channel sound carrier frequency $f_{as}$. That is, with respect to the free edge reflective-type surface wave resonator using SH-type surface waves, it is extremely difficult to form two resonance units having different resonance frequencies on the same substrate.

SUMMARY OF THE INVENTION

The preferred embodiments of present invention provide a free edge reflective-type surface wave resonator using SH-type surface waves in which at least two resonance units having different resonance frequencies are fabricated as a single unitary element.

More specifically, according to the preferred embodiments of the present invention, a free edge reflective-type surface wave resonator for reflecting SH-type surface waves between two confronting free edges of a piezoelectric substrate, includes a piezoelectric substrate having two confronting free edges, and an IDT provided on the piezoelectric substrate including a plurality of electrode fingers wherein electrode fingers are weighted by an apodized method or a withdraw method, wherein the weighting is performed so that an attenuation pole of a main lobe of the weighted IDT is located outside of a frequency position of an attenuation pole of a "normal" IDT (wherein "normal" refers to an unweighted IDT having equal cross widths between electrode fingers) having the same number of electrode finger pairs as the weighted IDT, and the electrode fingers of the weighted IDT being weighted such that a resonance characteristic determined by the main lobe of the weighted IDT and a plurality of resonance characteristics determined by the attenuation poles of the normal IDT are obtained.

That is, in the surface wave resonator of the preferred embodiments of the present invention, two or more resonance characteristics are obtained with only a single unitary element by using the attenuation pole of the normal IDT which has been suppressed in conventional resonators. The SH-type surface wave in this specification is broadly defined as containing not only BGS waves, but also surface waves like Love waves having a component whose displacement is substantially perpendicular to the propagation direction of the surface waves.

Further, the surface resonator of the preferred embodiments of the present invention is preferably used to constitute a trap circuit at the picture intermediate frequency stage of a television receiver or a video tape recorder. That is, the positions of the respective attenuation poles as described above are set so that one of the plural resonance characteristics is set as the adjacent channel picture carrier frequency ($f_{ap}$) and another resonance characteristic having a higher frequency is set as the adjacent channel video signal frequency ($f_{as}$), whereby a trap circuit having traps at the adjacent channel picture carrier frequency and the adjacent channel sound carrier frequency can be constructed by a single unitary element.

As described above, the resonance frequency $f_r$ of the free edge reflective-type surface wave resonator using BGS waves is determined as follows:

$f_r = v/\lambda$ ($\lambda$ represents the wavelength of surface wave excited by the IDT, and v represents the sound velocity of the piezoelectric substrate).

Further, the dimension L between the two confronting free edges of the piezoelectric substrate is preferably determined so as to satisfy the equation:

$L = (\lambda/2) \times n$ (n represents an integer).

Accordingly, when a resonator constituting a trap for the adjacent channel picture carrier frequency and a resonator constituting a trap for the adjacent channel sound carriers frequency, which are used at the picture intermediate frequency stage, are constructed by a free edge reflective-type surface wave resonator, the value of the dimension L is different between the above two resonators because they have greatly different wavelengths $\lambda$. Therefore, it has been hitherto considered as being difficult to form two resonators on the same chip or substrate.

On the other hand, according to the preferred embodiments of the present invention, the weighting is performed so that the attenuation pole of the main lobe of the weighted IDT is located outside of the frequency position of the attenuation pole of the normal unweighted IDT having the same number of electrode finger pairs. Accordingly, plural resonance characteristics are obtained, which are the resonance characteristic determined by the substrate dimension L as described above, that is, the resonance characteristic determined by the attenuation pole of the normal IDT and the resonance characteristic determined by the main lobe of the weighted IDT. That is, as is apparent from the foregoing description, by arranging the resonance characteristic determined by the main lobe of the weighted IDT and the resonance characteristic determined by the substrate dimension L, the free edge reflective-type surface wave resonator having plural resonance characteristics can be constructed despite the fact that it has a single-element unitary structure.

As described above, according to the preferred embodiments of the present invention, a free edge reflective-type surface wave resonator which achieves plural resonance characteristics despite its single-element unitary structure can be provided by weighting the IDT as described above, and an optimum surface wave resonator can be provided for use in devices requiring two resonance characteristics such as a trap circuit for a picture intermediate frequency stage. Since two resonance characteristics are achieved and provided by a single unitary element, the circuit construction of a trap circuit and other devices can be simplified and cumbersome connection work of several circuit elements can be omitted. In addition, the size of the trap circuit and similar devices can be effectively reduced.

For the purpose of illustrating the invention, there is shown in the drawings several preferred embodiments which are presently preferred, it being understood that the present invention is not limited to the precise structural arrangements and instrumentalities shown in the drawings.

DETAILED DESCRIPTION OF PREFERRED EMBODIMENTS

Preferred embodiments according to the present invention will be described with reference to the accompanying drawings.

Figure 4:
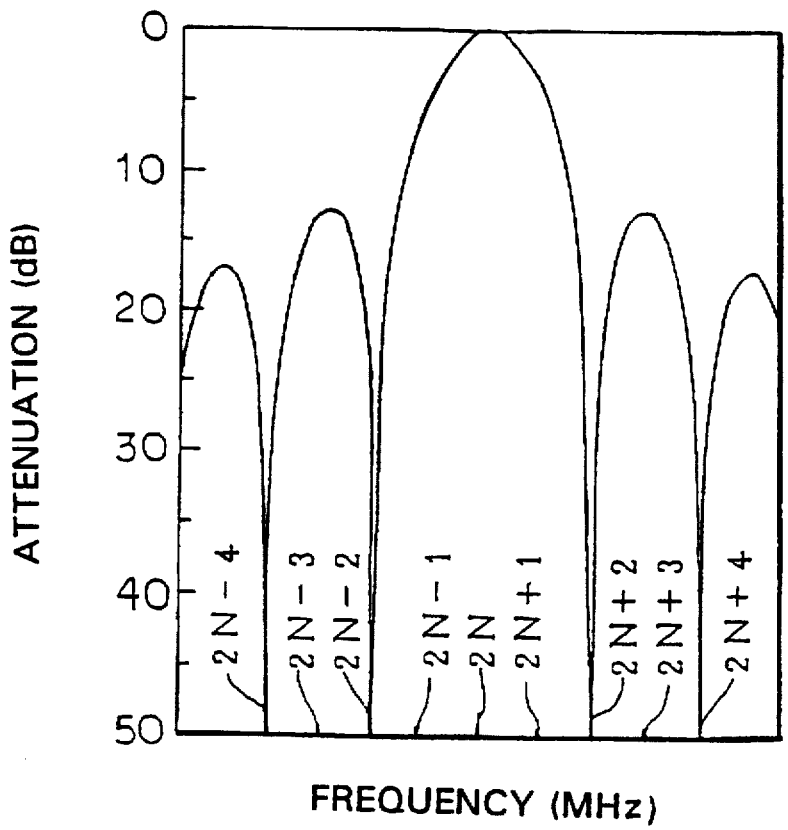
FIG. 4 is a diagram showing the frequency spectrum of a normal IDT.

FIG. 4 is a diagram showing the frequency spectrum of a normal unweighted IDT in a free edge reflective-type surface wave resonator using BGS waves. The frequency spectrum of the IDT is described in "Lecture Papers of Japan Acoustic Society", pp. 351-352, issued on March, 1976. The axis of the abscissa of FIG. 4 represents the frequency, and 2N, 2N-1, etc. on the axis of abscissa represent resonance points of a 2N-order mode, (2N-1)-order mode, etc. The axis of the ordinate represents an attenuation amount when the peak of a main lobe is set to 0 dB.

Figure 1:
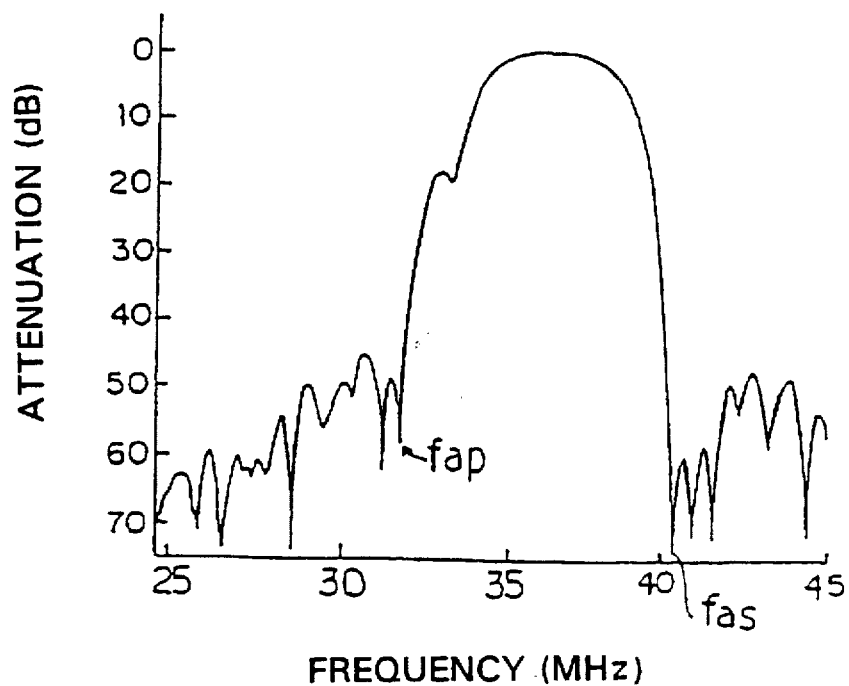
FIG. 1 is a graph showing an attenuation-frequency characteristic at a picture intermediate frequency stage of a television receiver.
Figure 2:
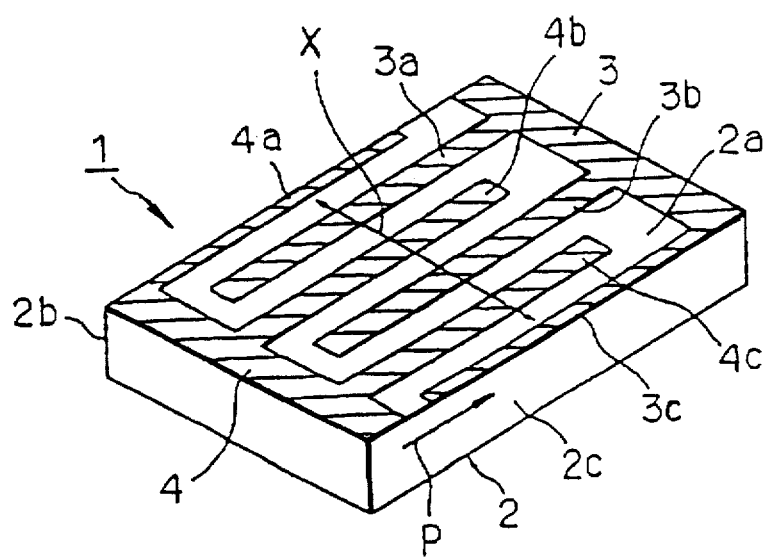
FIG. 2 is a perspective view showing a conventional free edge reflective-type surface wave resonator using BGS waves.
Figure 3:
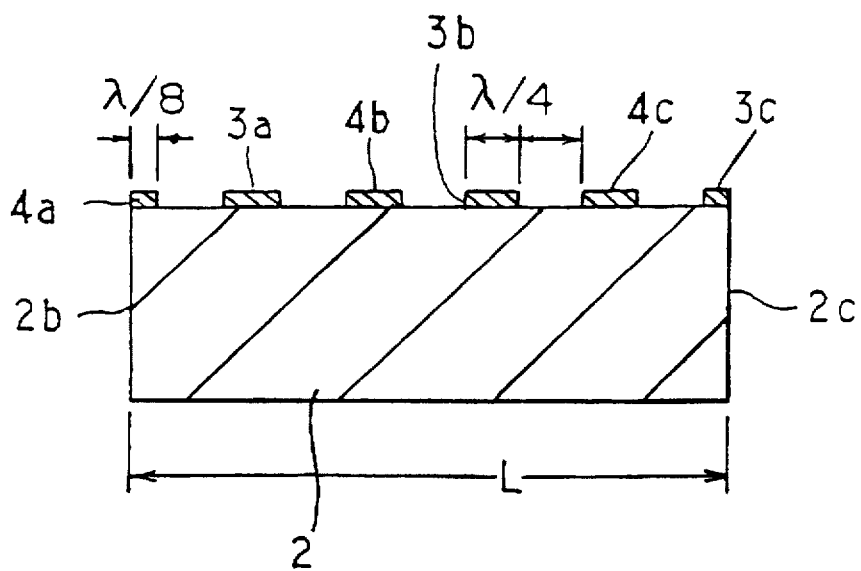
FIG. 3 is a cross-sectional view showing the conventional free edge reflective-type surface wave resonator.

As is apparent from FIG. 4, when a normal IDT is used, the resonance mode of 2N-order (N represents an integer) can be excited by forming an IDT having N pairs of electrode fingers on the surface of the piezoelectric substrate. Further, odd-number modes out of the other higher-order modes, that is, modes of (2N-1)-order, (2N-3)-order, (2N+1)-order and (2N+3)-order are not excited due to symmetry of the electrode. With respect to the even-number modes, as is apparent from FIG. 4, the resonance frequency is coincident with the attenuation pole of the frequency characteristic of the IDT having N pairs of electrode fingers so that these modes are not excited. That is, the even-number modes of (2N-2)-order, (2N-4)-order, (2N+2)-order, (2N+4)-order, etc. are not excited. Accordingly, only the 2N-order mode is excited in the free edge reflective-type surface wave resonator on which the normal IDT is formed as shown in FIG. 2, and thus a resonator having relatively little spurious can be formed. However, as described above, only a single resonance characteristic can be obtained by the surface wave resonator shown in FIG. 2.

On the other hand, according to the preferred embodiments of the present invention, plural resonance characteristics can be obtained by weighting the IDT as described. A weighting method will be hereunder described with reference to FIG. 5.

Figure 5:
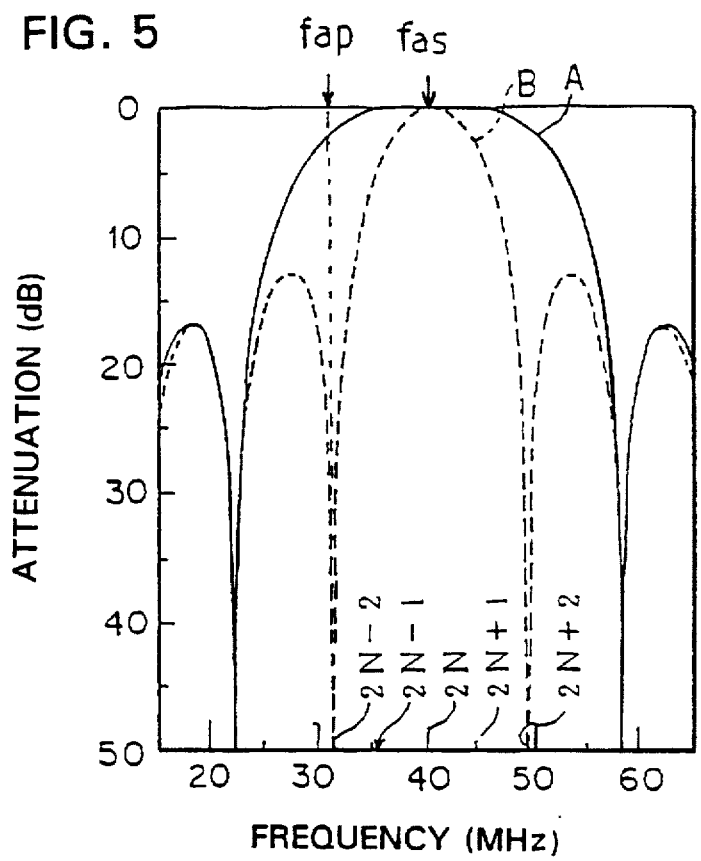
FIG. 5 is a diagram showing the frequency spectrum of a weighted IDT and the normal IDT.

A solid line A of FIG. 5 represents the frequency spectrum of the IDT when the IDT is subjected to a cross width weighting according to the preferred embodiments of the present invention, and a broken line B of FIG. 5 represents the frequency spectrum of a normal unweighted IDT having the same number of electrode finger pairs as the IDT weight by an apodized method. 2N, 2N-1, etc. represent the positions of resonance points of the 2N-order mode, the (2N-1)-order mode, etc. The attenuation pole of the main lobe of the IDT which is subjected to the weighting by an apodized method as described above is located outside of the attenuation poles 2N+2, 2N-2 of the main lobe of the normal IDT.

In the frequency spectrum A which is weighted by an apodized method, the attenuation amount is relatively small in the (2N-2)-order and (2N+2)-order modes, and thus it is apparent that the excitation can be achieved in these modes. In the preferred embodiments of the present invention, plural resonance characteristics are achieved by using the resonance characteristics which are closest to the excited even-number modes.

Figure 6:
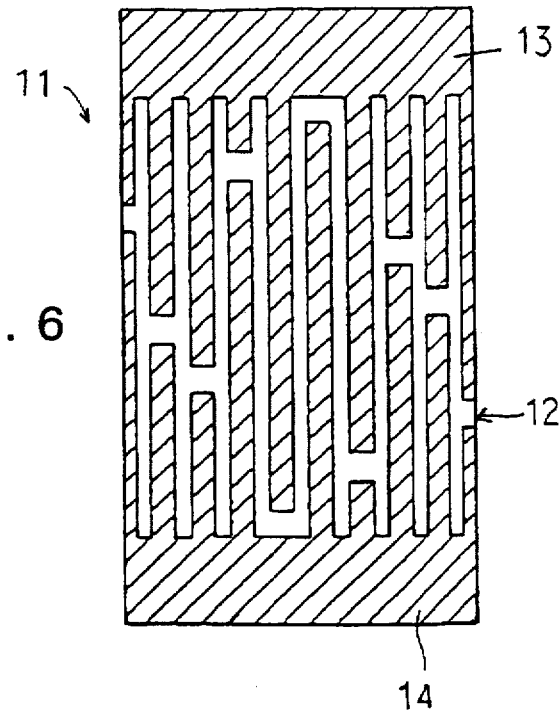
FIG. 6 is a diagram showing a free edge reflective-type surface wave resonator of a preferred embodiment of the present invention.

FIG. 6 shows an example of the weighting of the IDT having the frequency spectrum indicated by the solid line A in FIG. 5. The free edge reflective-type surface wave resonator 11 shown in FIG. 6 has a pair of comb-shaped electrodes 13 and 14 provided on a piezoelectric substrate 12. An IDT is constructed by these comb-shaped electrodes 13 and 14. As is apparent from FIG. 6, the IDT electrode is subjected to weighting by an apodized method. The degree of the weighting is selected so as to provide the frequency spectrum indicated by the solid line A in FIG. 5 as described above. However, the manner of the weighting to achieve the frequency spectrum indicated by the solid line A is not limited to that of FIG. 6. That is, the IDT having the frequency spectrum indicated by the solid line A of FIG. 5 may be formed by another electrode having a different shape from that of the comb-shaped electrodes 13 and 14 shown in FIG. 6. The weighting may be performed by a withdraw method. This weighting method has been well known, and it is described at pages 66 to 68 of "ELASTIC SURFACE WAVE ENGINEERING" supervised by Inuo Shibayama (Electrical Information Communication Society Corporation), for example.

The free edge reflective-type surface wave resonator 11 shown in FIG. 6 has a similar construction as the free edge reflective-type surface wave resonator shown in FIG. 2, except that the IDT is weighted in the manner as described above. Therefore, the same description of the same or corresponding elements as that of FIG. 2 is applied, and thus the detailed description thereof is omitted.

Figure 7:
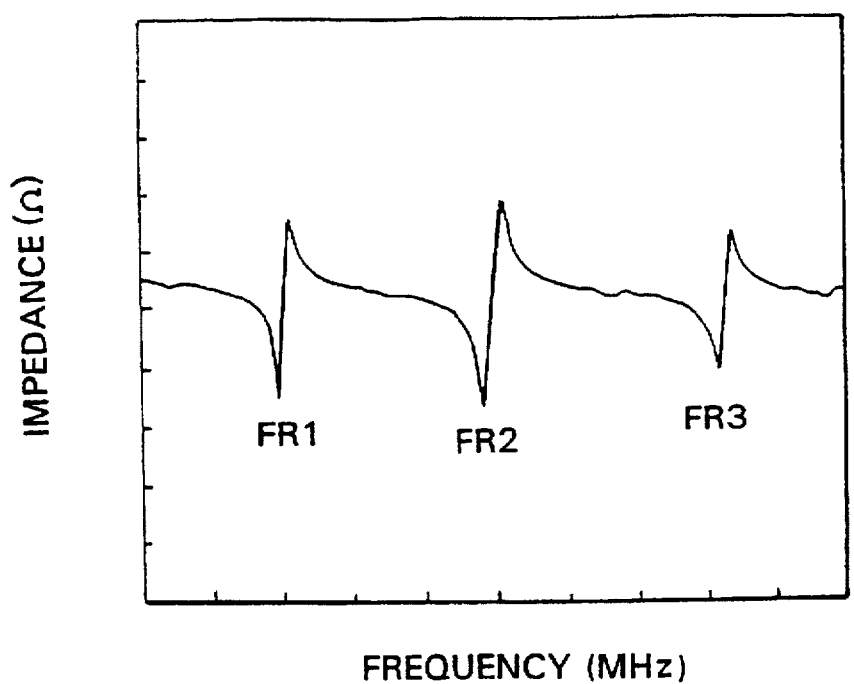
FIG. 7 is a diagram showing an impedance-frequency characteristic of the free edge reflective-type surface wave resonator of the preferred embodiment.

FIG. 7 is a graph showing an impedance-frequency characteristic of the free edge reflective-type surface wave resonator 11 using the cross-width weighted IDT as indicated by the solid line A of FIG. 5. As is apparent from FIG. 7, three resonance characteristics as represented by FR1, FR2 and FR3 are obtained. The FR1 represents the resonance point due to "spurious" corresponding to the (2N-2)-order mode in the frequency spectrum of the normal IDT which is determined by the substrate dimension as described above, the FR2 represents the resonance point of a resonance characteristic of the 2N-order mode of the main lobe of the IDT weighted by an apodized method and the FR3 represents the resonance point of a resonance characteristic of the (2N+2)-order mode. As is apparent from FIG. 7, three resonance characteristics can be obtained. Two traps can be constructed by using any two resonance points, for example, the resonance points FR1 and FR2.

Figure 8:
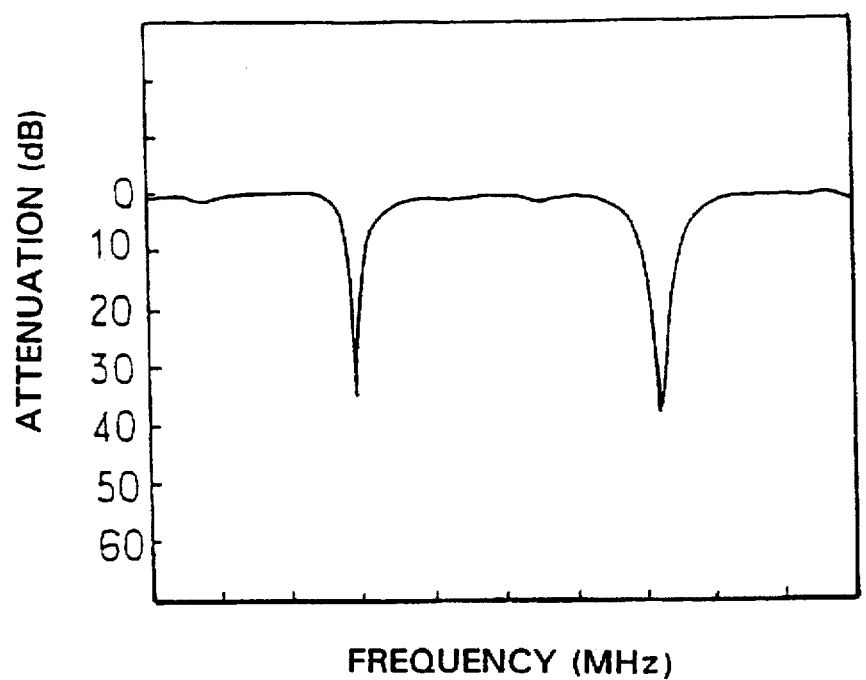
FIG. 8 is a diagram showing an attenuation-frequency characteristic of a trap filter which is constructed by the free edge reflective-type surface wave resonator of the preferred embodiment.

For example, if the free edge reflective-type surface wave resonator 11 is constructed so that the FR1 corresponds to the adjacent channel picture carrier frequency at the picture intermediate stage and the FR2 corresponds to the adjacent channel sound carrier frequency at the picture intermediate stage, the attenuation-frequency characteristic shown in FIG. 8 can be achieved.

That is, the wavelength of the IDT is determined in accordance with the adjacent channel sound carrier frequency, and the number of electrode finger pairs is determined in accordance with the adjacent channel picture carrier signal frequency. Further, the IDT is weighted so that the attenuation poles of the weighted IDT are located outside of the attenuation poles of the normal IDT having the same number of pairs of electrode fingers, whereby a resonator having two resonance characteristics and being formed of a single unitary element can be provided.

While preferred embodiments of the present invention have been disclosed, various modes of carrying out the principles described herein are contemplated as being within the scope of the following claims. Therefore, it is understood that the scope of the present invention is not to be limited except as otherwise set forth in the claims.

What is claimed is:

1. A free edge reflective-type surface wave resonator for reflecting SH-type surface waves between two confronting free edges of a piezoelectric substrate, the free edge reflective-type surface wave resonator comprising:

a piezoelectric substrate having two confronting free edges; and an interdigital transducer provided on said piezoelectric substrate and having a plurality of interdigitated electrode fingers that are weighted so that two attenuation poles of a main lobe of a resonance frequency spectrum obtained by said interdigital transducer are located outside of two attenuation poles of a main lobe of a frequency spectrum obtained in the case where an unweighted interdigital transducer having the same number of electrode finger pairs as said interdigital transducer is provided on said piezoelectric substrate.

2. The surface wave resonator as claimed in claim 1, wherein said surface wave resonator comprises a resonator which constitutes a trap circuit at a picture intermediate frequency stage of a television receiver, and one of a plurality of frequency characteristics corresponds to an adjacent channel picture carrier frequency and another of the plurality of frequency characteristics which has a higher frequency than said one of the plurality of frequency characteristics corresponds to an adjacent channel sound carrier frequency.

3. A free edge reflective-type surface wave resonator for reflecting SH-type surface waves between two confronting free edges of a piezoelectric substrate, the free edge reflective-type surface wave resonator, comprising:

a piezoelectric substrate having two confronting free edges; and an interdigital transducer provided on said piezoelectric substrate and having a number of interdigital electrode fingers that are weighted so that at least two resonant frequencies of even number modes of an unweighted transducer determined by a distance between said two confronting free edges of said substrate and the number of said interdigitated electrode fingers of said interdigital transducer, are located between frequencies of two attenuation poles which define a main lobe of a resonance frequency spectrum obtained by said interdigital transducer.

4. A free edge reflective-type surface wave resonator according to claim 3, wherein said interdigitated electrode fingers are weighted by a cross width weighting method.

5. A free edge reflective-type surface wave resonator according to claim 3, wherein said interdigitated electrode fingers are weighted by a thinning electrode method.

* * * * *